(12) United States Patent  (10) Patent No.: US 8,415,708 B2
Kim et al.  (45) Date of Patent: Apr. 9, 2013

(54) NITRIDE BASED SEMICONDUCTOR LIGHT-EMITTING DEVICE

(75) Inventors: Je Won Kim, Kyungki-do (KR); Jeong Tak Oh, Kyungki-do (KR); Dong Joon Kim, Seoul (KR); Sun Woon Kim, Seoul (KR); Jin Sub Park, Kyungki-do (KR); Kyu Han Lee, Kyungki-do (KR)

(73) Assignee: Samsung Electronics Co., Ltd., Seoul (KR)

( * ) Notice: Subject to any disclaimer, the term of this patent is extended or adjusted under 35 U.S.C. 154(b) by 26 days.

(21) Appl. No.: 12/911,320

(22) Filed: Oct. 25, 2010

(65) Prior Publication Data

US 2011/0037086 A1 Feb. 17, 2011

Related U.S. Application Data

(60) Continuation of application No. 11/380,415, filed on Apr. 26, 2006, now Pat. No. 7,893,443, which is a division of application No. 10/890,215, filed on Jul. 14, 2004, now abandoned.

(30) Foreign Application Priority Data

Feb. 18, 2004 (KR) .................................. 2004-10538

(51) Int. Cl.
*H01L 33/00* (2010.01)
(52) U.S. Cl. .............. 257/103; 257/79; 257/94; 257/95; 257/96; 257/97

(58) Field of Classification Search ............... 257/79, 257/94–97, 103, E33.008
See application file for complete search history.

(56) References Cited

U.S. PATENT DOCUMENTS

| 6,067,309 A * | 5/2000 | Onomura et al. ......... 372/46.01 |
| 6,590,234 B2 | 7/2003 | Kim et al. |
| 6,838,705 B1 | 1/2005 | Tanizawa |
| 6,858,877 B2 | 2/2005 | Kawaguchi et al. |
| 7,193,246 B1 | 3/2007 | Tanizawa et al. |

FOREIGN PATENT DOCUMENTS

| JP | 06-291368 | 10/1994 |
| JP | 2890396 | 2/1999 |
| JP | 11-068157 | 3/1999 |
| JP | 11-191641 | 7/1999 |
| JP | 2003-133589 | 5/2003 |

* cited by examiner

*Primary Examiner* — Tran Tran
(74) *Attorney, Agent, or Firm* — McDermott Will & Emery LLP

(57) ABSTRACT

Disclosed herein is a nitride-based semiconductor light-emitting device. The nitride-based semiconductor light-emitting device comprises an n-type clad layer made of n-type $Al_{x1}In_{y1}Ga_{(1-x1-y1)}N$ (where $0 \leq x_1 \leq 1$, $0 \leq y_1 \leq 1$, and $0 \leq x_1 + y_1 \leq 1$), a multiple quantum well-structured active layer made of undoped $In_A Ga_{1-A}N$ (where $0 < A < 1$) formed on the n-type clad layer, and a p-type clad layer formed on the active layer wherein the p-type clad layer includes at least a first layer made of p-type $In_{y2}Ga_{1-y2}N$ (where $0 \leq y_2 < 1$) formed on the active layer and a second layer made of p-type $Al_{x3}In_{y3}Ga_{(1-x3-y3)}N$ (where $0 < x_3 \leq 1$, $0 \leq y_3 \leq 1$, and $0 < x_3 + y_3 \leq 1$) formed on the first layer.

15 Claims, 2 Drawing Sheets

NITRIDE BASED SEMICONDUCTOR LIGHT-EMITTING DEVICE

RELATED APPLICATIONS

This application is a Continuation of U.S. patent application Ser. No. 11/380,415, filed on Apr. 26, 2006 now U.S. Pat. No. 7,893,443, which is a Divisional of U.S. patent application Ser. No. 10/890,215, filed on Jul. 14, 2004, which is now abandoned, and claims priority from, Korean Application Number 2004-10538, filed on Feb. 18, 2004, the disclosure of which is hereby incorporated by reference herein in its entirety.

BACKGROUND OF THE INVENTION

1. Field of the Invention

The present invention relates to a nitride-based semiconductor light-emitting device, and more particularly to a nitride-based semiconductor light-emitting device which employs a p-type clad layer structure with enhanced hole injection efficiency into an active layer, thereby exhibiting a high luminous efficiency.

2. Description of the Related Art

Generally, nitride-based semiconductor light-emitting devices are optical devices with a high output that generate short-wavelength light in the blue and green ranges and the like, and thus enable realization of the full color spectrum. For these reasons, nitride-based semiconductor light-emitting devices have drawn attention in related industrial fields.

Nitride-based semiconductor light-emitting devices are semiconductor single crystals composed of $Al_xIn_yGa_{(1-x-y)}N$ (wherein $0 \leq x \leq y$, $0 \leq y \leq 1$ and $0 \leq x+y \leq 1$) which can be grown on substrates, e.g., sapphire and SiC substrates, by metal organic chemical vapor deposition (MOCVD).

Nitride-based semiconductor light-emitting devices essentially consist of an n-type clad layer, an undoped active layer and a p-type clad layer. A conventional nitride-based semiconductor light-emitting devices is sectionally shown in FIG. 1.

Referring to FIG. 1, the conventional nitride-based semiconductor light-emitting device 10 comprises a sapphire substrate 11, and an n-type clad layer 13, an undoped active layer 15 and a p-type clad layer 17 deposited in this order on the sapphire substrate 11. In addition, the light-emitting device 10 further comprises an n-side electrode 19a and a p-side electrode 19b which are connected to the n-type clad layer 13 and the p-type clad layer 17, respectively. The active layer 15 may have a multiple quantum well structure in which a plurality of GaN quantum barrier layers and a plurality of InGaN quantum well layers are alternately laminated.

When an electric current is applied to the electrodes 19a and 19b, electrons emitted from the n-type clad layer 13 and holes generated from the p-type clad layer 17 are recombined together in the active layer 15 having a multiple quantum well structure to emit short-wavelength light in the green or blue ranges.

As generally illustrated in FIG. 1, the p-type clad layer 17 includes an electron blocking layer (EBL) 17b formed on the active layer 15 and a contact layer 17a formed on the electron blocking layer 17b. The electron blocking layer 17b may be made of a nitride semiconductor containing Al, such as p-type AlGaN, whereas the contact layer 17a may be made of a nitride semiconductor containing no Al, such as GaN.

Since the AlGaN electron blocking layer 15b has a larger energy band gap than a nitride semiconductor containing no or a small amount of Al, it can effectively prevent overflow of electrons emitted from the n-type clad layer 13 without recombination with holes in the active layer. As such, the p-type clad layer 17 including the EBL 17b can decrease the number of overflowing electrons, contributing to an improvement in the luminous efficiency of the light-emitting device 10.

However, since AlGaN not only has a lower hole mobility than any other nitride semiconductor layers, but also has a relatively low hole concentration (about $1 \times 10^{17}/cm^3$), the injection efficiency of holes generated from the p-side electrode 19b to the active layer 15 may be lowered, thus causing a problem in obtaining a high luminous efficiency.

Thus, there is a need in the art for a novel nitride-based light-emitting device which maintains the advantage of an EBL, i.e., prevention of electron overflow, and at the same time, enhances the efficiency of holes injected into an active layer, thereby remarkably improving the overall luminous efficiency in a complementary manner.

SUMMARY OF THE INVENTION

Therefore, the present invention has been made in view of the above problems, and it is an object of the present invention to provide a nitride-based semiconductor light-emitting device which employs a p-type clad layer structure consisting of an electron blocking layer (EBL), an active layer and a layer for enhancing hole injection efficiency (hereinafter referred to as a "hole injection efficiency-enhancing layer") interposed therebetween, thereby preventing electrons from overflowing and enhancing hole injection efficiency.

In order to accomplish the above object of the present invention, there is provided a nitride-based semiconductor light-emitting device comprising an n-type clad layer made of n-type $Al_{x1}In_{y1}Ga_{(1-x1-y1)}N$ (where $0 \leq x_1 \leq 1$, $0 \leq y_1$, and $0 \leq x_1+y_1 \leq 1$), a multiple quantum well-structured active layer made of undoped $In_AGa_{1-A}N$ (where $0<A<1$) formed on the n-type clad layer, and a p-type clad layer formed on the active layer wherein the p-type clad layer includes at least a first layer made of p-type $In_{y2}Ga_{1-y2}N$ (where $0 \leq y_2 < 1$) formed on the active layer and a second layer made of p-type $Al_{x3}In_{y3}Ga_{(1-x3-y3)}N$ (where $0<x_3 \leq 1$, $0 \leq y_3 \leq 1$, and $0<x_3+y_3 \leq 1$) formed on the first layer.

Preferably, the first layer is formed in such a manner that it has a higher doping concentration than the second layer. The thickness of the first layer is preferably adjusted to about 100 nm or less, and more preferably within the range of about 10 nm to about 30 nm.

In one embodiment of the present invention, the p-type clad layer may further include a third layer, as a p-type contact layer, made of p-type $In_{y4}Ga_{1-y4}N$ (where $0 \leq y_4 < 1$) formed on the second layer.

The third layer may consist of a low concentration p-type GaN semiconductor layer having a first doping concentration formed on the second layer, and a high concentration p-type GaN semiconductor layer having a concentration higher than the first doping concentration formed on the low concentration p-type GaN semiconductor layer.

In this embodiment, the thickness of the second layer is preferably adjusted within the range of about 50 nm to about 200 nm so as to sufficiently prevent overflow of electrons. In this case, the total thickness of the p-type clad layer may be at least 160 nm.

Preferably, the first layer is a GaN semiconductor layer, and the second layer is an AlGaN semiconductor layer. Further, the n-type clad layer is preferably a GaN semiconductor layer.

In order to enhance the injection efficiency of holes generated from the p-type clad layer while preventing current loss due to electron overflow, the p-type clad layer includes an electron blocking layer (EBL) as a nitride semiconductor layer containing Al, an active layer as a nitride semiconductor layer containing Al, and a nitride semiconductor layer containing no Al interposed between the two layers. The nitride semiconductor layer containing no Al, such as GaN, has a higher hole mobility (about 15 cm$^2$/Vs to about 20 cm$^2$/Vs) than the EBL containing Al (about 5 cm$^2$/Vs to about 10 cm$^2$/Vs). Further, from the viewpoint of hole concentration, a p-type GaN layer has a higher hole concentration ($5\times10^{17}$/cm$^3$) than a p-type AlGaN layer (about $1\times10^{17}$/cm$^3$).

In conclusion, since the nitride semiconductor layer containing no Al, such as GaN, is interposed between the EBL and the active layer, electron overflow is prevented by the EBL containing Al. At the same time, since the nitride semiconductor layer containing no Al is placed in contact with the active layer, hole injection efficiency is markedly enhanced.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Detailed description will be made of embodiments of the present invention with reference to the accompanying drawings.

Figure 1:
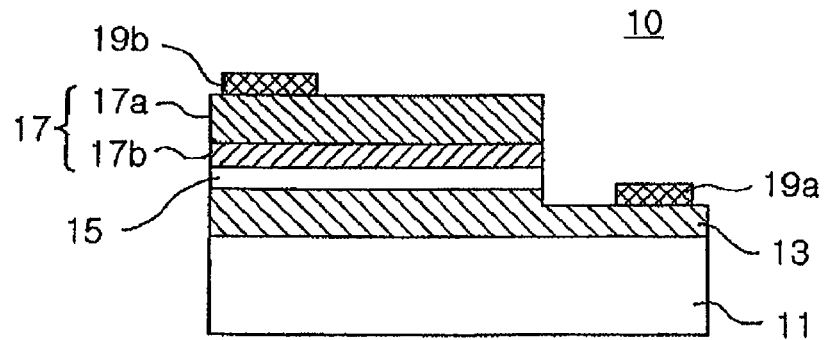
FIG. 1 is a side cross-sectional view of a conventional nitride-based semiconductor light-emitting device.
Figure 2:
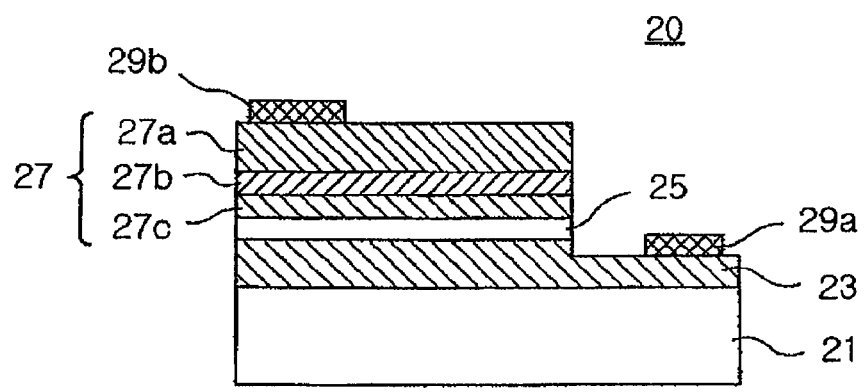
FIG. 2 is a side cross-sectional view of a nitride-based semiconductor light-emitting device according to one embodiment of the present invention.

FIG. 2 is a side cross-sectional view of a nitride-based semiconductor light-emitting device according to one embodiment of the present invention.

As illustrated in FIG. 2, the nitride-based semiconductor light-emitting device 20 according to one embodiment of the present invention comprises a sapphire substrate 21, and an n-type clad layer 23, an undoped active layer 25 and a p-type clad layer 27 deposited in this order on the sapphire substrate 21. The light-emitting device 20 further comprises an n-side electrode 29a and a p-side electrode 29b which are connected to the n-type clad layer 23 and the p-type clad layer 27, respectively. The active layer 25 may have a multiple quantum well structure in which a plurality of GaN quantum barrier layers and a plurality of InGaN quantum well layers are alternately laminated.

The n-type clad layer 23 formed on the sapphire substrate 21 may be a GaN layer, but is not limited thereto. As an example, the n-type clad layer 23 may be made of n-type $Al_x$—$In_{y1}Ga_{(1-x1-y1)}N$ (where $0 \leq x_1 \leq 1$, $0 \leq y_1 \leq 1$, and $0 \leq x_1+y_1 \leq 1$).

The active layer 25 formed on the n-type clad layer 23 may have a multiple quantum well structure, for example, a structure wherein a plurality of InGaN-based quantum well layers and a plurality of GaN-based quantum barrier layers are alternately laminated.

In this embodiment, the p-type clad layer 27 includes a first layer 27c for enhancing the hole injection efficiency, a second layer 27b as an EBL (electron blocking layer), and if necessary, a third layer 27a as a contact layer. The first layer 27c is formed on the active layer 25 and made of p-type $In_{y2}Ga_{1-y2}N$ (where $0 \leq y_2 < 1$), such as GaN. The second layer 27b is formed on the first layer 27c and made of p-type $Al_{x3}In_{y3}Ga_{(1-x3-y3)}N$ (where $0 < x_3 \leq 1$, $0 \leq y_3 \leq 1$ and $0 < x_3+y_3 \leq 1$). The third layer 27a may be made of p-type $In_{y4}Ga_{1-y4}N$ (where $0 \leq y_b < 1$).

As such, the first layer 27a, as a p-type contact layer, is made of a nitride semiconductor containing no Al, such as p-type GaN. The second layer 27b, as an electron blocking layer, is made of a nitride semiconductor containing Al, such as p-type AlGaN. The first layer 27c is made of a nitride semiconductor containing Al, such as p-type GaN. Since the first layer 27c containing no Al has a higher hole mobility and a higher impurity concentration than the second layer 27b, as an EBL, containing Al, it is advantageous in enhancing the hole injection efficiency.

For example, p-type AlGaN constituting a common p-type EBL has a hole mobility of about 5~10 cm$^2$/Vs and an impurity concentration of about $1\times10^{17}$/cm$^3$. In contrast, the p-type GaN layer that is employed as the layer for enhancing the hole injection efficiency in the present invention has a hole mobility of about 15 cm$^2$/Vs to about 20 cm$^2$/Vs and an impurity concentration of about $5\times10^{17}$/cm$^3$.

Accordingly, the hole injection efficiency-enhancing layer 27c containing no Al, such as GaN, interposed between the EBL 27b and the active layer 25 prevents electrons from overflowing due to the presence of the EBL 27b containing Al, and at the same time, markedly enhances the hole injection efficiency because it is formed on the active layer 25.

The hole injection efficiency-enhancing layer 27c as the third layer is preferably formed in such a manner that it has a higher p-type impurity (e.g., Mg) concentration than the EBL 27b as the second layer in order to further increase the hole injection efficiency. The larger the thickness of the hole injection efficiency-enhancing layer 27c, the greater the distance between the EBL 27b and the active layer 25. For this reason, it is difficult to achieve the function of the EBL 27b, i.e., prevention of electron overflow. Accordingly, the thickness of the hole injection efficiency-enhancing layer 27c is preferably adjusted to about 100 nm or less.

According to another aspect of the present invention, since the structure of the light-emitting device can greatly enhance the hole injection efficiency by using the hole injection efficiency-enhancing layer, such as GaN layer, interposed between the EBL and the active layer, it preferably permits the EBL to have a large thickness in order to efficiently prevent electron overflow without deteriorating the hole injection efficiency. The two functions, that is, hole injection efficiency and prevention of electron overflow, have been recognized, in conventional light-emitting devices, as working based on mutually exclusive principles. However, in the present invention, since the introduction of the hole injection efficiency-enhancing layer basically removes negative results (e.g., reduction of the hole injection efficiency) due to increased thickness of the EBL, the two functions can be improved in a complementary manner.

Figure 3:
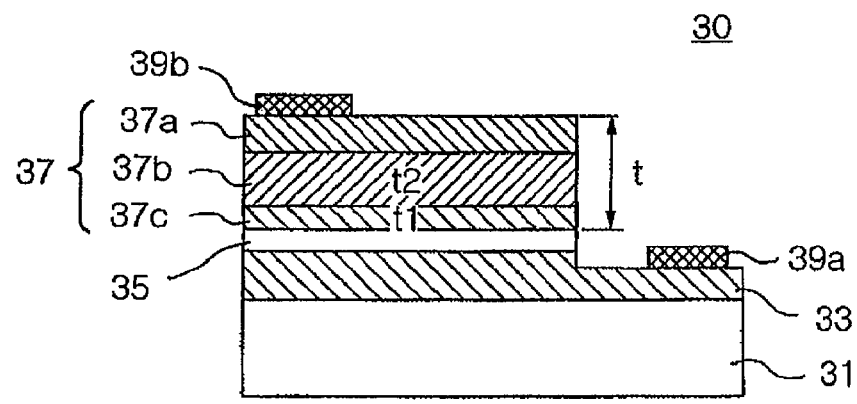
FIG. 3 is a side cross-sectional view of a nitride-based semiconductor light-emitting device according to another embodiment of the present invention.

FIG. 3 is a side cross-sectional view of a nitride-based semiconductor light-emitting device according to another embodiment of the present invention.

The nitride-based semiconductor light-emitting device 30 illustrated in FIG. 3 comprises a sapphire substrate 31, and an n-type clad layer 33, an undoped active layer 35 and a p-type clad layer 37 deposited in this order on the sapphire substrate 31. The light-emitting device 30 further comprises an n-side electrode 39a and a p-side electrode 39b which are connected to the n-type clad layer 33 and the p-type clad layer 37, respectively. Similarly to the structure shown in FIG. 2, the p-type clad layer 37 includes a first layer 37c for enhancing the hole injection efficiency, a second layer 37b as an EBL, and if necessary, a third layer 37a as a contact layer.

The first layer 37c for enhancing the hole injection efficiency may be made of p-type GaN, and the second layer 37b as an EBL may be made of p-type AlGaN. Further, the third layer 37a as a contact layer of the p-type clad layer may be made of p-type GaN. The third layer 37a preferably includes a first p-type GaN layer having a first impurity concentration and a second p-type GaN layer having a second impurity concentration higher than the first impurity concentration.

As explained previously, the thickness ($t_1$) of the first layer 37c is preferably adjusted to about 100 nm or less, and more preferably within the range of about 10 nm to about 30 nm, so as not to deteriorate the function of the EBL. Above about 10 nm, sufficient hole injection efficiency can be achieved. Below about 30 nm, there is no deterioration in the function of the EBL.

In addition, to sufficiently ensure the function of the EBL, the thickness ($t_2$) of the second layer 37b is preferably in the range of about 50 nm to about 200 nm. Conventionally, based on problems associated with crystal growth of nitride semiconductors containing Al and reduction in hole injection efficiency due to improved function of EBL, the thickness of the EBL has been adjusted to less than 50 nm. In contrast, since the hole injection efficiency-enhancing layer is in contact with the active layer in the present invention, the hole injection efficiency is enhanced while effectively preventing electron overflow.

Under these circumstances, taking account of the thickness of the third layer 37a as a contact layer, the p-type clad layer 37 employed in the present invention is preferably formed to a thickness of at least 160 nm.

Hereinafter, the operation and effects of the present invention will be explained in more detail with reference to specific examples.

Example 1

In order to identify the improvement in the characteristics of the nitride-based semiconductor light-emitting device according to the present invention, the nitride-based semiconductor light-emitting device shown in FIG. 2 was fabricated.

First, after a GaN low temperature-nuclei growing layer as a buffer layer was formed on a sapphire substrate, an n-type GaN clad layer was formed thereon so as to have an impurity concentration of $4\times10^{18}/cm^3$. Thereafter, a multiple quantum well-structured active layer composed of five $In_{0.15}Ga_{0.85}N$ quantum well layers and five GaN quantum barrier layers was formed on the n-type clad layer.

Further, a hole injection efficiency-enhancing layer made of p-type GaN, an electron blocking layer (EBL) made of p-type $Al_{0.15}Ga_{0.85}N$, and a contact layer made of p-type GaN were deposited sequentially on the active layer to prepare a p-type clad layer. The hole injection efficiency-enhancing layer was formed so as to have an impurity concentration of about $5\times10^{17}/cm^3$ and a thickness of about 20 nm. The electron blocking layer was formed so as to have an impurity concentration of about $1\times10^{17}/cm^3$ and a thickness of about 20 nm. Further, the contact layer was formed so as to have an impurity concentration of about $5\times10^{17}/cm^3$ and a thickness of about 76 nm.

Finally, a transparent electrode layer containing Ni was formed on the p-type clad layer, and then an n-side electrode and a p-side electrode were formed on the n-type clad layer and the p-type clad layer, respectively, to fabricate the final nitride-based semiconductor light-emitting device.

Example 2

To observe changes in the characteristics of the nitride-based semiconductor light-emitting device of the present invention according to increasing thickness of the p-type EBL, the thickness of the EBL was increased, compared to in the light-emitting device fabricated in Example 1.

In this example, a nitride-based semiconductor light-emitting device was fabricated in the same manner as in Example 1, except that the structure of the p-type clad layer was varied. Specifically, a hole injection efficiency-enhancing layer was made of p-type GaN so as to have an impurity concentration of about $5\times10^{17}/cm^3$ and a thickness of about 20 nm, an electron blocking layer was made of p-type $Al_{0.15}Ga_{0.85}N$ so as to have an impurity concentration of $1\times10^{17}/cm^3$ and a thickness of about 69 nm, and a p-type contact layer was made of p-type GaN so as to have an impurity concentration of $5\times10^{17}/cm^3$ and a thickness of about 76 nm.

Comparative Example 1

A nitride-based semiconductor light-emitting device was fabricated in the same manner as in Example 1, except that the hole injection efficiency-enhancing layer was not formed so that the p-type clad layer includes the EBL and the contact layer only. Specifically, the EBL and the contact layer were sequentially formed on the active layer without the formation of the hole injection efficiency-enhancing layer. The electron blocking layer made of p-type $Al_{0.15}Ga_{0.85}N$ was formed so as to have an impurity concentration of about $1\times10^{17}/cm^3$ and a thickness of about 20 nm, and the p-type contact layer made of p-type GaN was formed so as to have an impurity concentration of about $5\times10^{17}/cm^3$ and a thickness of about 76 nm, as in Example 1.

To observe the electrical properties of the nitride-based semiconductor light-emitting devices fabricated in Examples 1 and 2, and Comparative Example 1, first, forward voltage characteristics (at 20 mA) of the nitride-based semiconductor light-emitting devices of Example 1 and Comparative Example 1 were measured. As a result, the nitride-based semiconductor light-emitting device of Comparative Example 1 was shown to have a forward voltage of about 3.39V, whereas the nitride-based semiconductor light-emitting device of Example 1 into which the hole injection efficiency-enhancing layer made of p-type GaN was introduced was shown to have a forward voltage of 3.09V. That is, it was confirmed that the presence of the hole injection efficiency-enhancing layer in the nitride-based semiconductor light-emitting device of the present invention lowered the forward voltage by about 0.3V, indicating that the forward voltage characteristics were improved.

Similarly to this, the reverse voltage characteristics of the nitride-based semiconductor light-emitting devices fabricated in Examples 1 and 2 (at −20 mA) were measured. The nitride-based semiconductor light-emitting device of Example 1 was shown to have a reverse voltage of about 9.5V, whereas the nitride-based semiconductor light-emitting device of Example 2 was shown to have a reverse voltage of about 10.6V. It was confirmed from these results that the nitride-based semiconductor light-emitting device of Example 2 had a higher reverse voltage by about 0.9V than the nitride-based semiconductor light-emitting device of Example 1.

It has been demonstrated that the introduction of the hole injection efficiency-enhancing layer and increased thickness of the p-type EBL can enhance the hole injection efficiency and effectively prevent electron overflow.

Figure 4:
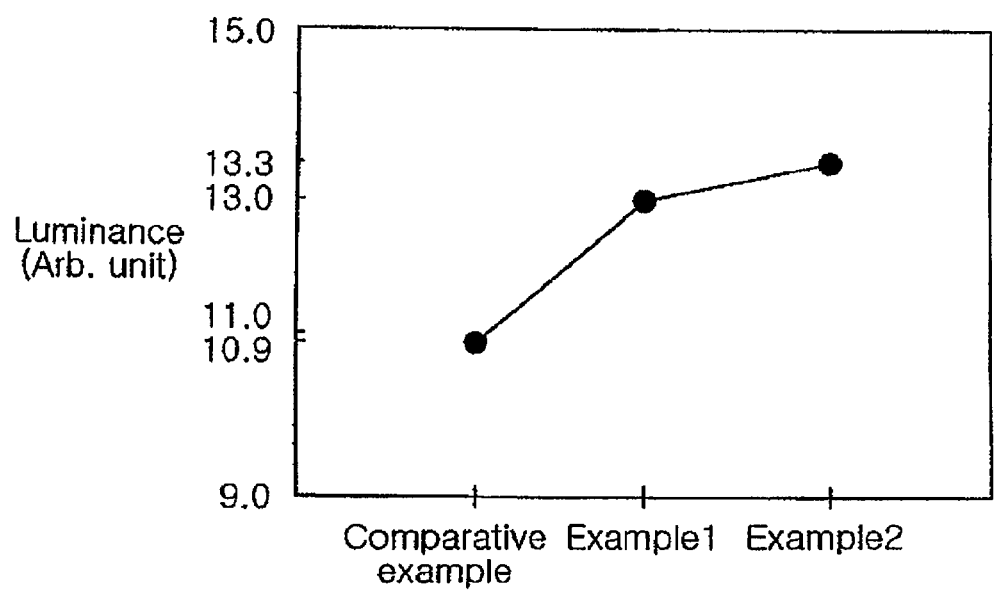
FIG. 4 is a graph comparing the luminance characteristics between a nitride-based semiconductor light-emitting device fabricated in Comparative Example 1 and nitride-based semiconductor light-emitting devices fabricated in Examples 1 and 2 of the present invention.

Additionally, the luminance characteristics of the nitride-based semiconductor light-emitting devices of Examples 1 and 2, and Comparative Example 1 were observed. The luminance characteristics were measured in the wavelength region of 464 nm under the same conditions. The results are shown in FIG. 4.

The nitride-based semiconductor light-emitting device of Comparative Example 1 had a luminance of only 10.9 (Arbitrary unit), whereas the nitride-based semiconductor light-emitting device of Example 1 wherein the p-type GaN hole injection efficiency-enhancing layer was interposed between the EBL and the active layer had a luminance of about 13.0 (Arb. unit), which was higher by about 2.1. In addition, the nitride-based semiconductor light-emitting device of Example 2 wherein the hole injection efficiency-enhancing layer was introduced and the thickness of the p-type EBL was as large as 6.9 nm had a luminance of about 13.3 (Arb. unit), which was higher by about 0.3 than that of Example 1.

In conclusion, since the hole injection efficiency-enhancing layer containing no Al, such as GaN, as a nitride semiconductor layer, is interposed between the EBL and the active layer, and at the same time, is placed in contact with the active layer, the hole injection efficiency can be markedly enhanced. Moreover, since the EBL with increased thickness effectively prevents electrons from overflowing, the electrical properties and luminance characteristics can be improved.

The scope of the present invention is not limited by the above embodiments and the accompanying drawings, but only by the appended claims. Therefore, those skilled in the art will appreciate that various modifications, additions and substitutions are possible, without departing from the technical spirit of the invention as disclosed in the appended claims.

As apparent from the above description, since the nitride-based semiconductor light-emitting device of the present invention employs a p-type clad layer in which a nitride semiconductor layer is interposed between an EBL and an active layer, the function of the EBL, i.e., prevention of electron overflow, is maintained, and at the same time, the efficiency of holes injected into an active layer is remarkably enhanced. In addition, since the nitride-based semiconductor light-emitting device of the present invention permits the use of an EBL having a large thickness in order to efficiently prevent electron overflow without deteriorating the hole injection efficiency, it can improve the two functions, that is, hole injection efficiency and prevention of electron overflow, based on mutually exclusive principles, in a complementary manner.

What is claimed is:

1. A nitride-based semiconductor light-emitting device, comprising:
    a first clad layer made of $Al_{x1}In_{y1}Ga_{(1-x1-y1)}N$ (where $0<x_1<1$, $0<y_1<1$, and $0<x_1+y_1<1$);
    a multiple quantum well-structured active layer made of undoped $In_AGa_{1-A}N$ (where $0\leq A<1$) formed on the first clad layer; and
    a second clad layer formed on the multiple quantum well-structured active layer, including a first layer made of $In_{y2}Ga_{1-y2}N$ (where $0<y_2<1$) formed on the active layer and a second layer made of $Al_{x3}In_{y3}Ga_{(1-x3-y3)}N$ (where $0<x_3<1$, $0<y_3<1$, and $0<x_3+y_3<1$) formed on the first layer and a third layer made of $In_{y4}Ga_{1-y4}N$ (where $0\leq y4<1$) formed on the second layer, the first layer being configured to enhance hole injection efficiency in the active layer and the second layer being configured to block electron from overflowing into the active layer,
    wherein the thickness of the first layer is smaller than the thickness of the second layer,
    wherein the first layer is substantially Al-free, wherein the first layer is in contact with the multiple quantum well-structured active layer, and
    wherein the third layer consist of a low concentration p-type GaN semiconductor layer having a first doping concentration formed on the second layer, and a high concentration p-type GaN semiconductor layer having a concentration higher than the first doping concentration formed on the low concentration p-type GaN semiconductor layer.

2. The nitride-based semiconductor light-emitting device according to claim 1, wherein the second layer has a thickness of about 50 nm to about 200 nm.

3. The nitride-based semiconductor light-emitting device according to claim 1, wherein the second clad layer has a thickness of at least 160 nm.

4. The nitride-based semiconductor light-emitting device according to 1, wherein the first layer is a GaN semiconductor layer and the second layer is an AlGaN semiconductor layer.

5. The nitride-based semiconductor light-emitting device according to claim 1, wherein the first clad layer is a GaN semiconductor layer.

6. A nitride-based semiconductor light-emitting device, comprising:
    a first clad layer made of $Al_{x1}In_{y1}Ga_{(1-x1-y1)}N$ (where $0<x_1<1$, $0<y_1<1$, and $0<x_1+y_1<1$);
    an active layer comprising a multiple quantum well-structure made of undoped $In_AGa_{1-A}N$ (where $0<A<1$) formed on the first clad layer; and
    a second clad layer formed on the multiple quantum well-structured active layer, including at least a first layer made of GaN formed on the multiple quantum well-structured active layer and a second layer made of $Al_{x3}Ga_{(1-x3)}N$ (where $0<x_3<1$) disposed on the first layer, wherein:
    the first and second layers are configured to enhance hole injection efficiency in the active layer and block electron from overflowing into the active layer, such that the first layer has a thickness of greater than 10 nm and not greater than 30 nm and the thickness of the first layer is smaller than the thickness of the second layer,
    the first layer is substantially Al-free,
    the first layer is in contact with the multiple quantum well-structured active layer,
    the second clad layer further includes a third layer made of $In_{y4}Ga_{1-y4}N$ (where $0<y4<1$) formed on the second layer, and
    the third layer consist of a low concentration GaN semiconductor layer having a first doping concentration formed on the second layer, and a high concentration GaN semiconductor layer having a concentration higher than the first doping concentration formed on the low concentration GaN semiconductor layer.

7. The nitride-based semiconductor light-emitting device according to claim 6, wherein the second layer has a higher Al concentration than the first layer.

8. The nitride-based semiconductor light-emitting device according to claim 6, wherein the second layer is disposed directly on the first layer.

9. The nitride-based semiconductor light-emitting device according to claim 6, wherein the thickness of the third layer is larger than the thickness of the first layer.

10. The nitride-based semiconductor light-emitting device according to claim 6, wherein the third layer includes a first p-type GaN semiconductor layer and a second p-type GaN semiconductor layer which has a doping concentration different from that of the first p-type GaN semiconductor layer.

11. The nitride-based semiconductor light-emitting device according to claim 10, wherein the first p-type GaN semiconductor layer is disposed closer to the second layer than the second p-type GaN semiconductor layer, and a doping concentration of the first p-type GaN semiconductor layer is lower than that of the second p-type GaN semiconductor layer.

12. The nitride-based semiconductor light-emitting device according to claim 6, wherein the first layer has a higher hole mobility than the second layer.

13. The nitride-based semiconductor light-emitting device according to claim 12, wherein the hole mobility of the first layer is from 15 cm$^2$/Vs to 20 cm$^2$/Vs, and the hole mobility of the second layer is from 5 cm$^2$/Vs to 10 cm$^2$/Vs.

14. The nitride-based semiconductor light-emitting device according to claim 12, wherein the first layer has a higher doping concentration than the second layer.

15. A nitride-based semiconductor light-emitting device, comprising:
a first clad layer made of $Al_{x1}In_{y1}Ga_{(1-x1-y1)}N$ (where $0<x_1<1$, $0<y_1<1$, and $0<x_1+y_1<1$);
a multiple quantum well-structured active layer made of undoped $In_AGa_{1-A}N$ (where $0-A<1$) formed on the first clad layer; and
a second clad layer formed on the multiple quantum well-structured active layer, including at least a first layer made of $In_{y2}Ga_{1-y2}N$ (where $0<y_2<1$) formed on the active layer and a second layer made of $Al_{x3}In_{y3}Ga_{(1-x3-y3)}N$ (where $0<x_3<1$, $0<y_3<1$, and $0<x_3+y_3<1$) formed on the first layer, wherein:
the first and second layers are configured to enhance hole injection efficiency in the active layer and block electron from overflowing into the active layer, such that the first layer has a thickness of greater than 10 nm and not greater than 30 nm,
the first layer is substantially Al-free,
the first layer is in contact with the multiple quantum well-structured active layer,
the second clad layer further includes a third layer made of $In_{y4}Ga_{1-y4}N$ (where $0<y4<1$) formed on the second layer, and
the third layer consist of a low concentration GaN semiconductor layer having a first doping concentration formed on the second layer, and a high concentration GaN semiconductor layer having a concentration higher than the first doping concentration formed on the low concentration GaN semiconductor layer.

* * * * *

UNITED STATES PATENT AND TRADEMARK OFFICE
CERTIFICATE OF CORRECTION

PATENT NO. : 8,415,708 B2
APPLICATION NO. : 12/911320
DATED : April 9, 2013
INVENTOR(S) : Je Won Kim et al.

It is certified that error appears in the above-identified patent and that said Letters Patent is hereby corrected as shown below:

In the specification of the patent, in column 4 line 16, the line should read –"As such, the third layer 27a, as p-type contact layer"- rather than "As such, the first layer 27a, as p-type contact layer".

In the specification of the patent, in column 4 lines 41-42, the line should read –"The hole injection efficiency-enhancing layer 27c as the first layer"- rather than "The hole injection efficiency-enhancing layer 27c as the third layer".

Signed and Sealed this
Thirtieth Day of July, 2013

Teresa Stanek Rea
*Acting Director of the United States Patent and Trademark Office*